United States Patent
Bhandarkar et al.

[11] Patent Number: 5,976,625
[45] Date of Patent: Nov. 2, 1999

[54] PROCESS FOR FORMING PATTERNED DIELECTRIC OXIDE FILMS

[75] Inventors: Suhas Dattatreya Bhandarkar, Glen Gardner; Edwin Arthur Chandross, Murray Hill; David Wilfred Johnson, Jr., Bedminster, all of N.J.

[73] Assignee: Lucent Technologies Inc., Murray Hill, N.J.

[21] Appl. No.: 09/056,133

[22] Filed: Apr. 7, 1998

Related U.S. Application Data

[60] Provisional application No. 60/043,235, Apr. 11, 1997.

[51] Int. Cl.$^6$ .................................. B05D 5/12; B05D 1/36
[52] U.S. Cl. ......................... 427/269; 427/287; 427/79; 433/906; 433/974
[58] Field of Search .................................. 427/126.3, 79, 427/226, 287, 269; 438/906, 974

[56] References Cited

U.S. PATENT DOCUMENTS

| | | |
|---|---|---|
| 5,368,887 | 11/1994 | Hoshino et al. . |
| 5,378,502 | 1/1995 | Willard et al. ........................... 427/269 |
| 5,433,956 | 7/1995 | Patel . |
| 5,461,022 | 10/1995 | Dosch et al. . |
| 5,470,802 | 11/1995 | Gnade et al. . |
| 5,637,507 | 6/1997 | Wicks et al. . |
| 5,863,679 | 1/1999 | Tsushima et al. ...................... 427/287 |

OTHER PUBLICATIONS

Binker, C.J. et al. "The Physics and Chemistry of Sol–Gel Processing", Sol–Gel Science, Academic Press, Inc. no month available (1990).

Angst, D.L. et al., "Moisture Absorption Characteristics of Organosiloxane Self–Assembled Monolayers", Langmuir, vol. 7, No. 10, pp. 2236–2242 mo month available (1991).

*Primary Examiner*—Brian K. Talbot
*Attorney, Agent, or Firm*—Patricia A. Verlangieri

[57] ABSTRACT

A method for forming a dielectric oxide layer on selected areas of a substrate is disclosed. The dielectric oxide layer is formed on selected areas of the substrate using a sol process. The substrate has an area of a first material and an area of a second material which is different from the first. The first material is coated with a layer of a first compound. The layer of the first compound has a hydrophobic top surface. The second material is coated with a layer of a second compound. The layer of the second compound has a hydrophilic top surface. A layer of hydrous oxide is formed over the second compound by applying an aqueous sol solution on the surface of the substrate. The substrate is then heated to remove the first compound and the second compound from the surface of the substrate. Thereafter, the substrate with the layer of hydrous oxide thereon, is sintered to form the dielectric oxide layer.

16 Claims, 2 Drawing Sheets

PROCESS FOR FORMING PATTERNED DIELECTRIC OXIDE FILMS

CROSS-REFERENCE TO RELATED APPLICATION

This application claims priority of Provisional Application Serial No. 60/043235 which was filed Apr. 11, 1997 now abandoned.

FIELD OF THE INVENTION

The present invention relates generally to the fabrication of integrated circuits and the like devices, and more particularly, to methods for patterning dielectric oxide films.

DESCRIPTION OF THE RELATED ART

As the overall dimensions of semiconductor devices continue to shrink, the demand is ever increasing for devices having high charge storage capacity. The need for high charge storage capacity is a result of the reduction in the chip area available for individual components as integrated circuits are scaled to smaller dimensions. For example, when the surface area of a component such as a capacitor is reduced, a corresponding reduction in charge storage capability occurs. The smaller surface area available for components such as transistors, capacitors, and the like, coupled with the requirement to maintain high charge storage levels has led researchers in the field of fabrication science to seek new materials from which to construct these components. One group of materials that has garnered increasing attention are dielectric oxides such as ferroelectric materials and piezoelectric materials. The term dielectric oxide refers to a material that has a dielectric constant greater than about 10 and is useful for making capacitive devices.

Ferroelectric materials, a sub-category of dielectric oxides, are attractive because these materials are capable of being polarized by an applied voltage and retaining the polarization after the applied voltage is removed. The ability to retain the polarization state makes dielectric oxides useful compounds from which to construct memory devices such as random access memory (RAM) devices. Other devices of interest include capacitive devices such as decoupling capacitors, bypass capacitors and high-frequency capacitors.

Thin films of dielectric oxides are formed on a substrate using a variety of methods such as, for example, rf-sputtering, laser ablation, chemical vapor deposition (CVD), and sol techniques. Of these several methods, the sol (or the sol-gel) technique has the advantage of utilizing inexpensive materials and equipment which is attractive for fabricating low-cost devices.

In the sol technique, a solution containing the desired metal elements is prepared by dissolving organometallic or other soluble precursors of the metal elements in different solvents, and then mixing the different solutions together. After mixing, water is added to hydrolyze the metal-organics and the resultant sol is then applied on a substrate. The sol is typically applied using spin coating techniques, wherein the substrate is held stationary while the solution is applied over the surface and the substrate then spun to drive off excess solution and leave a layer of material on the surface of the substrate. Alternatively, the layer of material is formed on the substrate by dipping the substrate in the sol. The substrate with the layer of material thereon, is then baked and sintered to form a dielectric oxide.

While sol techniques have been widely used for the formation of dielectric oxide films, for most potential applications success depends on the ability to pattern such films to form features having the desired device geometries and dimensions. Typically, the dielectric oxide films formed using the sol-gel technique are patterned by etching. However, etching steps potentially limit the choices for the dielectric oxide materials, since many dielectric oxide materials are not easily etched in common gaseous etchants. Additionally, the etchants may not be compatible with other materials used to fabricate the device. Also, such etching steps usually require expensive, lithographic processes. Overcoming such processing limitations is important, when fabricating devices using dielectric oxide films.

SUMMARY OF THE INVENTION

The present invention is directed to a process for making a device, in which a patterned dielectric oxide layer is formed on a substrate. The dielectric oxide layer is formed on selected areas of the substrate using a sol process. For the purpose of this description, the substrate has an area of a first material and an area of a second material. The second material is different from the first material and defines a region of the substrate upon which the dielectric oxide layer is selectively formed. In turn, the first material defines a region of the substrate on which the layer of dielectric oxide is not formed.

In the process of the present invention, the area of the first material is coated with a layer of a first compound. The first material is coated by soaking the substrate in a solution of the first compound dissolved in a solvent. Conditions required for coating the first material depend on the composition of the first compound and are well known to those skilled in the art.

The molecular structure of the first compound has a substantially straight chain configuration which includes a first end and a second end. Attached at the first end of the first compound is a first moiety and at the second end is a second moiety. The second moiety is a hydrophobic moiety and is different from the first moiety. The term hydrophobic moiety as used in this disclosure refers to a moiety which repels water. An example of a hydrophobic moiety is a methyl ($-CH_3$) group.

The first moiety, attached at the first end of the first compound, selectively binds to the surface of the first material with a binding energy that is substantially greater then the binding energy between the hydrophobic moiety and the surface of the first material. The binding of the first moiety to the surface of the first material orients the first compound so the first moiety is positioned at the interface of the first material and the layer of the first compound and causes the top surface of the layer of the first compound to be hydrophobic.

Thereafter, the area of the second material is coated with a layer of a second compound. The second material is coated by soaking the substrate in a solution of second compound dissolved in a solvent. It is important that the solution containing the second compound be substantially inert with respect to the first compound formed on the first material, so the layer of the second compound preferentially forms on the second material. Conditions required for coating the second material depend on the composition of the first compound and are well known to those skilled in the art.

The molecular structure of the second compound has a substantially straight chain configuration which includes a first end and a second end. Attached at the first end of the second compound is a first moiety and attached at the second end is a second moiety. The second moiety is a hydrophilic moiety and is different from the first moiety. The term hydrophilic moiety as used in this disclosure refers to a moiety which has an affinity for water. Examples of suitable hydrophilic moieties include hydroxyl (—OH) groups and carboxyl groups.

The first moiety, attached at the first end of the second compound, selectively binds to the surface of the second material with a binding energy that is substantially greater then the binding energy between the hydrophilic moiety and the surface of the second material. The binding of the first moiety on the surface of the second material orients the second compound so the first moiety is positioned at the interface of the second material and the layer of the second compound and causes the top surface of the layer of the second compound to be hydrophilic.

After the first material is coated with the layer of the first compound and the second material is coated with the layer of the second compound, a dielectric oxide layer is formed on the layer of the second compound. The dielectric oxide layer is formed by applying an aqueous sol on the surface of the substrate. The aqueous sol comprises a mixture of a hydrous oxide and water. Aqueous sols containing hydrous oxides suitable for deposition using the process of the present invention are well known to those skilled in the art. An example is a solution of barium strontium titanate.

The aqueous sol that is applied on the substrate selectively deposits hydrous oxide on the layer of the second compound. The hydrous oxide selectively deposits on the layer of the second compound because the hydrophilic top surface of the layer of the second compound (hydrophilic) has an affinity for the water in the aqueous sol, which facilitates wetting of such surface by the sol and thus the deposition of the hydrous oxide. The hydrous oxide does not deposit significantly on the layer of the first compound, because the hydrophobic top surface of the layer of the first compound is not wet by the water in the aqueous sol.

After the hydrous oxide deposits over the layer of the second compound, the substrate is heated to a temperature sufficient to evaporate the water and solvents from the substrate surface and remove both the first compound and the second compound from the substrate. Thereafter, the substrate is subjected to conditions that sinter the hydrous oxide, thereby forming the dielectric oxide layer.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

In the present process, a feature of a device is patterned by forming a dielectric oxide layer on selected areas of a substrate surface. The dielectric oxide has a dielectric constant greater than about 10. The dielectric oxide layer is formed on selected areas of the substrate using a sol process.

Figure 1:
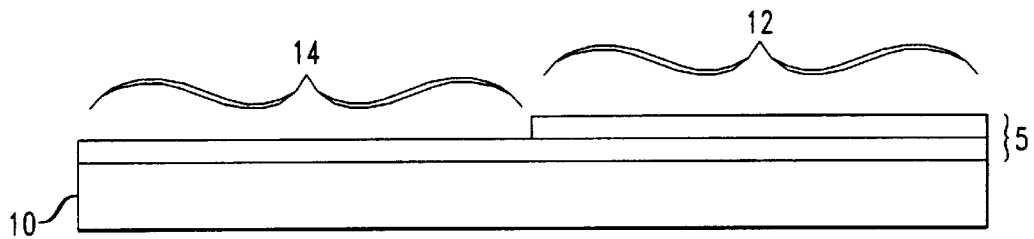
FIG. 1 is a side view of a substrate with a multi-layered structure formed thereon.

For the purpose of this description, the substrate 10 is defined to have an area of a first material 14 and an area of a second material 12, as illustrated in FIG. 1. The first material 14 is different from the second material 12. The area of the second material 12 defines a region of the substrate 10 surface on which the dielectric oxide is selectively formed. Hence, the area of the first material 14 defines a region of the substrate upon which the dielectric oxide is not formed.

As shown in FIG. 1, the substrate 10 has a multilayered structure 5, thereon. Materials useful for forming the multilayered structure 5 include metals 7 such as gold and platinum, and oxides 9 such as silicon dioxide. Typically, at least the top layer is patterned; i.e. the layer is formed over a portion of the substrate.

Figure 2:
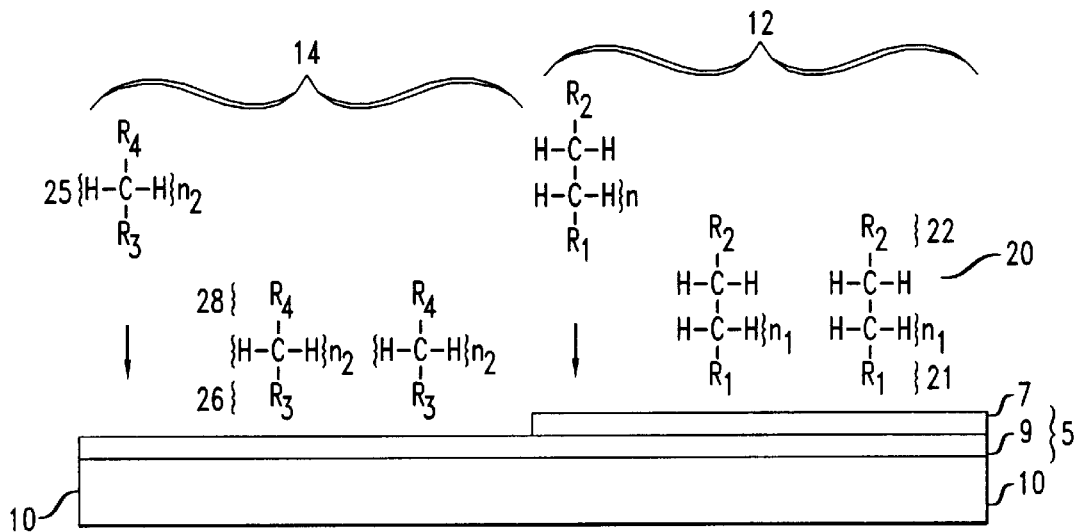
FIG. 2 is illustrative of present process wherein a layer of a first compound coats a first area of the substrate and a layer of a second compound coats a second area of the substrate.

Prior to the formation of the dielectric oxide, the surface of the area of the first material 14 is coated with a layer of a first compound 25, as shown in FIG. 2. The surface of the first material 14 is coated by soaking the substrate 10 in a solution of the first compound 25 dissolved in a solvent. Conditions required to dissolve the first compound in the solvent depend on the composition of the compound and are well known to those skilled in the art.

The first compound 25 has a substantially straight chain configuration with a first end, denoted as 26, and a second end, denoted as 28. Attached at the first end 26 of the first compound 25 is a first moiety $R_3$ and attached at the second end is a second moiety $R_4$. The second moiety $R_4$ is a hydrophobic moiety and is different from the first moiety $R_3$. A hydrophobic moiety is a moiety that repels water.

The first moiety $R_3$, attached at the first end 26 of the first compound 25, selectively binds to the surface of the first material 14. The first moiety $R_3$ has a binding energy that is substantially greater than the binding energy between the hydrophobic moiety and the surface of the first material 14. The binding of the first moiety $R_3$ to the surface of the first material depends on the composition of the first material, and preferably involves the formation of chemical bonds with the surface of the first material 14.

The binding of the first moiety $R_3$ attached at the first end 26 of the first compound 25, to the surface of the first material 14, causes the first compound 25 to have an orientation wherein the first moiety $R_3$ is positioned at the interface of the first material 14 and the layer of the first compound 25, while the hydrophobic moiety $R_4$ is positioned at the top surface of the layer of the first compound. It is important that the hydrophobic moiety $R_4$ be positioned at the top surface of the layer of the second compound 25, so the hydrophobic moiety prevents interaction with the aqueous sol.

The solvent is also preferably substantially inert with respect to the first moiety $R_3$, which binds to the surface of the first material. It is important for the solvent to be inert with respect to the first moiety $R_3$ so this moiety preferentially binds with the surface of the first area and does not react with the solvent. Conditions required to dissolve the first compound 20 in the solvent depend on the composition of the compound and are well known to those skilled in the art.

The molecular structure of the first compound 25 has a substantially straight chain configuration, denoted as $n_2$, and preferably has between twelve to thirty carbon atoms. Chains with this range of carbon atoms provides a substantially hydrophobic layer which is necessary to prevent interaction with the aqueous sol. Chains having fewer than twelve carbon atoms are undesirable because such chains are easily desorbed from the surface of the substrate. Chains having more than thirty carbon atoms are undesirable because chain folding potentially occurs. The chain folding causes non-hydrophobic regions to form on the surface of the layer of the first compound 25, due to random packing of these molecules. Non-hydrophobic regions potentially interact with the aqueous sol forming a layer of dielectric oxide thereon.

The layer of the first compound 25 preferably comprises a monolayer of molecules having a thickness less than about 30 Å. Layers with thickness greater than about 30 Å typically include excess molecules of the first compound 25 which are not bound to the first material 14. The molecules of the first compound that are not bound to the surface of the first material are oriented randomly. This random orientation causes the top surface of the first compound 25 to have regions that are not hydrophobic, which interact with the aqueous sol. Typically, the excess molecules of the first compound that are not bound to the surface of the first material 14 are removed by rinsing the substrate with a solvent. The solvent is one in which the first compound is dissolved.

Compounds useful as the first compound in the present process are well known to those skilled in the art. For example, when the first area 14 of the substrate 10 is silicon dioxide, tri-substituted, di-substituted and mono-substituted alkylhalosilanes are suited for use as the first compound. The tri-substituted alkylhalosilanes are preferable because the mono-substituted and di-substituted alkylhalosilanes bind less strongly to the silicon dioxide surface. Other compounds which bind to silicon dioxide and are potentially useful as the first compound are the corresponding alkoxyalkylsilanes. However, alkoxyalkylsilanes are less reactive than the substituted alkylhalosilanes thereby requiring longer times to bind to the silicon dioxide surface.

Figure 3:
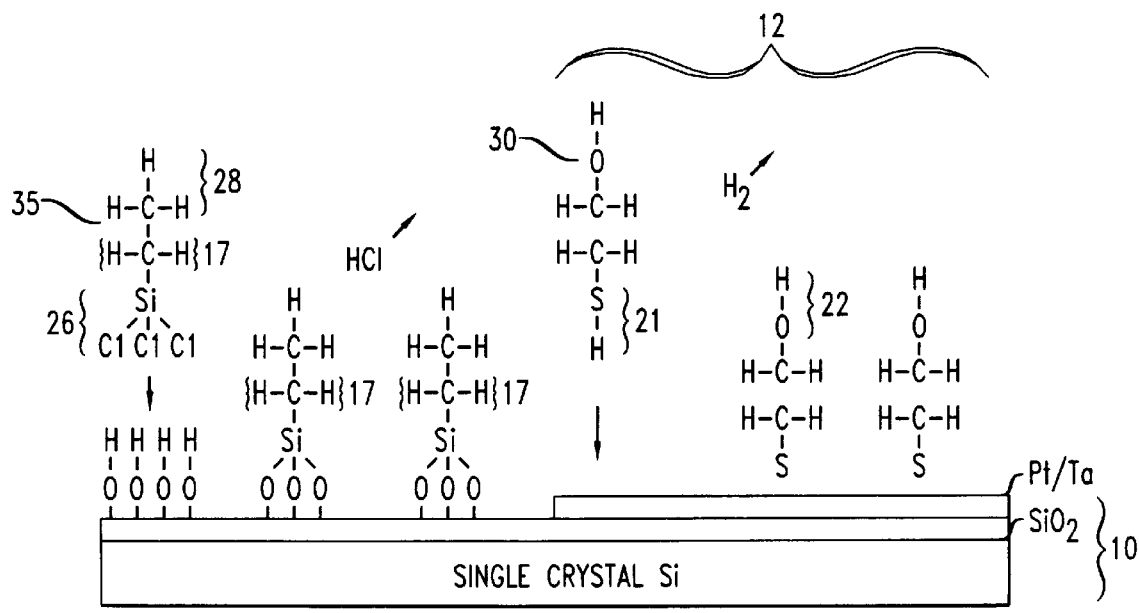
FIG. 3 is illustrative of the present process wherein the first area of the substrate is treated with octadecyltrichlorosilane and the second area is coated with mercaptoethanol.

One tri-substituted alkylhalosilane suitable for use as the first compound on a silicon dioxide surface, is octadecyltrichlorosilane 35, shown in FIG. 3. Octadecyltrichlorosilane (OTS) 35 has a hydrophobic methyl (—$CH_3$) moiety at the second end 28 and a $SiCl_3$ moiety at the first end 26. The $SiCl_3$ moiety binds to the silicon dioxide surface.

Thereafter, the surface of the second material 12 is coated with a layer of a second compound 20, as shown in FIG. 2. The surface of the second material 12 is coated by soaking the substrate 10 in a solution of the second compound 20 dissolved in a solvent. The time necessary for forming the layer of the second compound on the surface of the second material varies and is dependent on the concentration of the second compound dissolved in the solvent.

The second compound 20 is an $\alpha,\omega$-disubstituted alkane having substantially a straight chain configuration with a first end, denoted as 21, and a second end, denoted as 22. Attached at the first end 21 of the second compound 20 is a first moiety $R_1$ and attached at the second end 22 is a second moiety $R_2$. The second moiety $R_2$ is a hydrophilic moiety and is different from the first moiety $R_1$. A hydrophilic moiety is a moiety which has an affinity for water.

The first moiety $R_1$, attached at the first end 21 of the second compound 20, selectively binds to the surface of the second material 12. The first moiety $R_1$ has a binding energy that is substantially greater than the binding energy between the hydrophilic moiety and the surface of the second material. The binding of the first moiety $R_1$ to the surface of the second material depends on the composition of the second material 12, and preferably involves the formation of bonds such as covalent bonds and/or mixed covalent-metallic bonds with the surface of the second material.

The binding of the first moiety $R_1$ to the surface of the second material 12, causes the second compound 20 to have an orientation wherein the first moiety $R_1$ is positioned at the interface of the second material and the layer of the second compound, while the hydrophilic moiety $R_2$ is positioned at the top surface of the layer of the second compound. It is important that the hydrophilic moiety $R_2$ is positioned at the top surface of the layer of the second compound, so such hydrophilic moieties $R_2$ interact with the aqueous sol and facilitate the formation of the dielectric oxide material over the layer of the second compound 20.

The substantially straight chain configuration for the second compound 20, denoted as $n_1$, preferably has between two to eighteen carbon atoms. Chains having more than eighteen carbon atoms are undesirable because partial chain folding potentially occurs. Partial chain folding affects the orientation of the alkane molecules, so that some regions on the top surface of the layer of the second compound 20 are not hydrophilic. The absence of the hydrophilic top surface for the layer of the second compound 20 interferes with the formation of the dielectric oxide material on the area of the second material 12.

The layer of the second compound 20 preferably comprises a monolayer of molecules having a thickness less than about 30 Å. Layers with thickness greater than about 30 Å comprise excess molecules of the second compound 20 which are not bound to the surface of the second material 12. The molecules of the second compound that are not bound to the surface of the second material are oriented randomly. This random orientation causes the top surface of the second compound 20 to have regions that are not hydrophilic, which interferes with the formation of the dielectric oxide over the second material 12. Typically, the excess molecules of the second compound that are not bound to the surface of the second material are removed by rinsing the substrate with a solvent. The solvent is one in which the first compound is dissolved.

Compounds useful as the second compound in the present process are well known to those skilled in the art. For example, when the second material 12 is a bi-metal layer of platinum/tantalum, a mercaptoalcohol such as mercaptoethanol 30, as shown in FIG. 3, is suitable for use as the second compound. The mercaptoethanol 30 has a hydrophilic hydroxyl group (—OH) at the second end 22 and a thiol (—SH) group at the first end 21. The thiol (—SH) group binds to the metal (i.e., platinum). An example of another moiety which binds with metal surfaces such as platinum is a compound containing a nitrile or isonitrile group.

In the process of the present invention, it is important that the formation of the second compound on the surface of the second material, not substantially interfere with the previously formed layer of the first compound. Therefore, both the second compound and the solvent in which it is dissolved are substantially inert with respect to the first compound. Otherwise, the layer of the second compound potentially forms over the layer of the first compound instead of selectively forming on the second area of the substrate.

Additionally, a variable order is contemplated for performing the steps wherein the first material and second material are coated with the first compound and the second compound, respectively. For example, it is contemplated that the second compound be formed on the second material prior to the formation of the first compound on the first material. For such a process, the first compound and the solvent in which it is dissolved are preferably substantially inert with respect to the second compound.

After both the first material and the second material are coated with the first and second compounds, respectively, an aqueous sol is applied on the substrate 10. The aqueous sol is applied on the substrate using conventional techniques such as spin coating and dip coating.

The aqueous sol is a mixture of hydrous oxide and water. Aqueous sols comprising hydrous oxides suitable for use in the present process are well known to those skilled in the art and depend on the properties desired for the resulting device. An example of a suitable hydrous oxide is barium strontium titanate.

Figure 4:
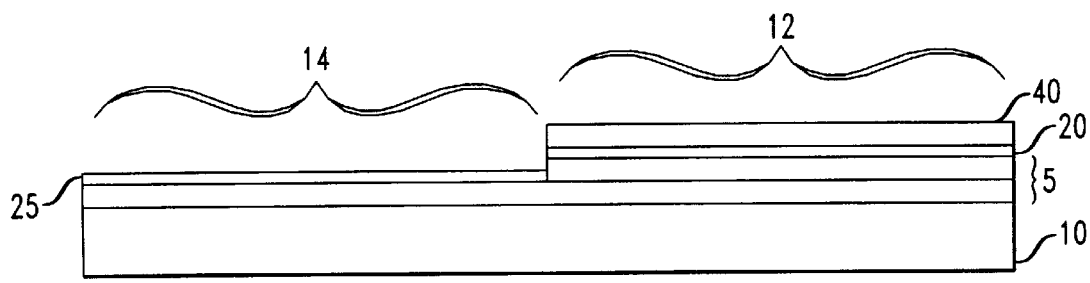
FIG. 4 is illustrative of the present process wherein a layer of dielectric oxide is formed over the layer of the second compound.

The aqueous sol applied on the surface of the substrate selectively deposits hydrous oxide 40 over the layer of the second compound 20, as illustrated in FIG. 4. The hydrous oxide 40 selectively deposits over the layer of the second compound 20 because the hydrophilic moiety $R_2$, attached at the second end 22 of the second compound 20 facilitates wetting of the second material by the aqueous sol. The hydrous oxide 40 does not deposit on the first material 14, over the layer of the first compound 25, because the hydrophobic moiety $R_4$ attached to the second end 28 of the first compound 25 repels the water in the aqueous sol.

The thickness of the layer of hydrous oxide formed over the surface of the second compound is variable and depends on the composition of the sol and the conditions under which it is applied on the surface of the second material (i.e., spin speed, dipping rate). Thicknesses for the layer of hydrous oxide formed from a single application of the sol on the surface of the second material are preferably from about 500 to 5000 Å. Thickness less than 500 Å are undesirable because noncontinuous layers are potentially formed. Thickness greater than about 5000 Å are undesirable because such layers potentially crack and peel off the surface of the substrate, when the substrates are subsequently heated. Also, thick dielectric layers result in less capacitance per unit area. When it is desirable to achieve layers with thicknesses greater than about 5000 Å, multiple applications of the sol solution are deposited on the surface of the substrate. The multiple layers are dried between each application of the aqueous sol solution.

After the hydrous oxide 40 deposits over the layer of the first compound 20, the substrate 10 is heated to evaporate the water and other solvents from the substrate surface and to desorb both the first compound 25 and the second compound 20 from the substrate 10. Conditions required to desorb the first compound 25 and the second compound 20 depend on the particular compounds that are formed on the surface of the substrate and are well known to those skilled in the art. Heating the substrate to a temperature within the range 125° C. to 600° C. typically removes both the first compound 25 and the second compound 20.

Thereafter, the hydrous oxide 40 is sintered to convert it to a dielectric oxide layer. Conditions required to convert the hydrous oxide to the dielectric oxide layer depend on the composition of the hydrous oxide material and are well known to those skilled in the art. For example, barium strontium titanate is typically sintered at a temperature within the range 500 ° C. to 1000 ° C.

The following examples are exemplary of the suitable conditions employed in the inventive procedure.

EXAMPLE 1

A 4 inch diameter single crystal silicon wafer having a layer of 1000 nm thick silicon dioxide with a series of solid metal features formed thereon was obtained. The features were 20 μm×3 cm strips of platinum/titanium (Pt/Ti), about 100 nm thick, deposited by chemical vapor deposition (CVD). The wafer was cleaned by rinsing with ethanol followed by chloroform, a total of three times.

Octadecyltrichlorosilane was dissolved in chloroform at room temperature to form a $1.0\times10^{-3}$ M solution. The cleaned wafer was immersed in the OTS solution under constant stirring action (~150 rpm) to form a layer of OTS on the exposed silicon dioxide regions. The wafer was immersed in the OTS solution up to 24 hours. The wafer was removed form the OTS solution and rinsed with toluene a total of three times.

Mercaptoethanol was dissolved in ethyl alcohol at room temperature to form a $1.0\times10^{-3}$ M solution. The wafer was immersed in the mercaptoethanol solution for up to 24 hours to form a layer of mercaptoethanol on the exposed Pt/Ti metal regions. The wafer was removed form the mercaptoethanol and rinsed with deionized water (18 megohm) a total of three times.

Equal molar amounts of barium acetate (1.57 g) and strontium acetate (3.51 g) were combined with acetic acid (5.6 ml) and the mixture heated at 85° C. for 1 hour to dissolve the salts. Titanium isopropoxide (3.51 g) was then added to the mixture. The resulting mixture had the desired a Ba:Sr:Ti molar ratio of 1:1:2. Deionized water (18 megohm) was added to achieve a water:titanium isopropoxide molar ratio of 1000:1 and form a barium strontium titanate sol.

The OTS and mercaptoethanol coated wafer was immersed in the barium strontium titanate sol and withdrawn at a rate of about 2 mm/sec. The barium strontium titanate was deposited over the mercaptoethanol coated regions of the wafer. The wafer was dried at 50° C. for 30 minutes in wet oxygen, by placing the wafer in an enclosure where gaseous oxygen ($O_2$) gas was bubbled through deionized water (18 megohm).

Thereafter, the wafer was heated to 350° C. in air to evaporate the water and other solvents in the deposited sol material and to remove the OTS material and the mercaptoethanol. The layer of barium strontium titanate was sintered at a temperature of about 750° C. for up to two hours.

EXAMPLE 2

A 4 inch silicon wafer was prepared having features as described in Example 1. The wafer was sequentially coated with OTS and mercaptoethanol using the materials and conditions described in Example 1.

The wafer was then dipped in the barium strontium titanate sol and dried a total of three times according to the conditions described in Example 1. Thereafter, the wafer was heated and sintered as described in Example 1.

Figure 5:
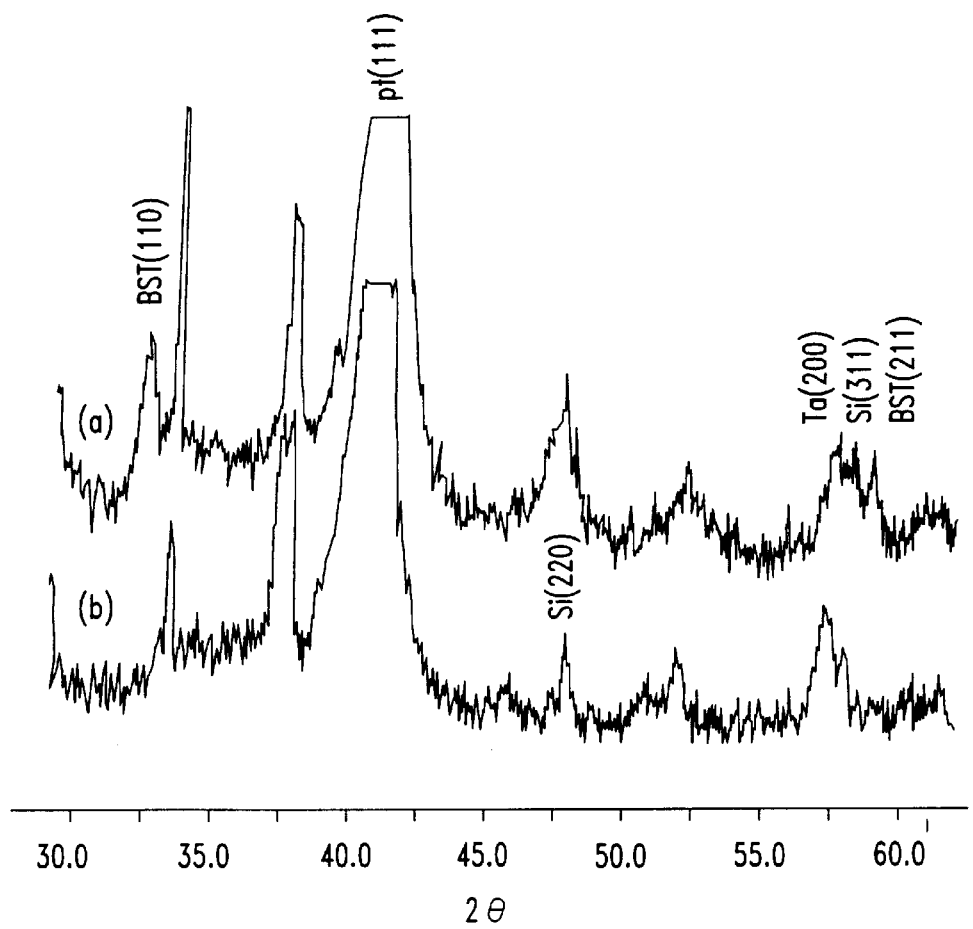
FIG. 5 is an X-ray photoelectron spectroscopy (XPS) trace for a barium strontium titanate layer formed over a substrate as described in Example 2.

XPS (X-ray photoelectron spectroscopy) spectra taken from the Pt/Ta and the silicon dioxide regions of the wafer are illustrated in FIG. 5. Photoelectron peaks corresponding to Ba, Sr, and Ti are all present in the Pt/Ta region shown in FIG. 5(a). These elements are the constituents of the barium strontium titanate sol. Peaks were also present which can be attributed to Pt and Ta, over which the barium strontium titanate was deposited. In contrast, Si is shown to be the major component in the silicon dioxide region, shown in FIG. 5(b). A peak attributed to Pt is also present in the spectra of FIG. 5(b) which is attributed to trace residues from patterning of the Pt/Ta features.

The invention claimed is:

1. A method for fabricating a device, comprising the steps of:

providing a substrate with a surface having at least an area of a first material and an area of a second material, wherein the first material is different from the second material;

forming a layer of a first compound on the area of the first material, wherein the first compound has a substantially straight chain molecular configuration with a first end and a second end and a first moiety at the first end and a second moiety at the second end and wherein the second moiety is a hydrophobic moiety and the first moiety is different from the second moiety and the first moiety selectively binds to the first material with a binding energy that is substantially greater than the binding energy between the second moiety and the first material such that the first compound is substantially oriented with the first moiety at the interface of the first material and the layer of the first compound and the hydrophobic moiety at the top surface of the layer of the first compound;

forming a layer of a second compound on the area of the second material, wherein the second compound has a substantially straight chain molecular configuration with a first end and a second end and a first moiety at the first end and a second moiety at the second end and wherein the second moiety is a hydrophilic moiety and the first moiety is different from the second moiety and the first moiety selectively binds to the second material with a binding energy that is substantially greater than the binding energy between the second moiety and the second material such that the second compound is substantially oriented with the first moiety at the interface of the second material and the layer of the second compound and the hydrophilic moiety at the top surface of the layer of the second compound;

applying an aqueous sol comprising a mixture of hydrous oxide and water on the substrate which selectively deposits onto the layer of the second compound;

heating the substrate at a temperature and for a time sufficient to evaporate the water from the substrate surface and desorb both the first compound and the second compound from the substrate surface;

sintering the hydrous oxide, thereby forming a dielectric oxide layer on the substrate.

2. The method of claim 1, wherein the second compound has about two to eighteen carbon atoms between the first moiety and the second moiety.

3. The method of claim 1, wherein the hydrophilic moiety on the second compound is selected form the group consisting of a hydroxy (—OH) functional group and a carboxyl functional group.

4. The method of claim 1, wherein the second compound is a mercaptoalcohol.

5. The method of claim 4, wherein the mercaptoalcohol is mercaptoethanol.

6. The method of claim 1, wherein first compound has about twelve to thirty carbon atoms between the first moiety and the second moiety.

7. The method of claim 1, wherein the hydrophobic moiety on the first compound is $CX_3$, wherein X is selected from the group consisting of hydrogen, fluorine, and chlorine.

8. The method of claim 7, wherein the first compound is octadecyltrichlorosilane (OTS).

9. The method of claim 1, wherein the second material is a metal.

10. The method of claim 9, wherein the metal is selected from the group consisting of gold and platinum group metals.

11. The method of claim 1, wherein the first material is an oxide.

12. The method of claim 11, wherein the oxide is silicon dioxide.

13. The method of claim 1, wherein the substrate is heated at a temperature within the range 150° C. to 600° C.

14. The method of claim 1, wherein the hydrous oxide is sintered at a temperature within the range 500° C. to 1000° C.

15. The method of claim 1, wherein the layer of the second compound is formed by immersing the substrate in a solution comprising a mixture of the second compound dissolved in a solvent, wherein the solvent is substantially inert with respect to the first moiety.

16. The method of claim 15, wherein the solvent is selected from the group consisting of xylene, toluene and chloroform.

* * * * *